United States Patent [19]

Kawamoto et al.

[11] Patent Number: 4,457,952
[45] Date of Patent: Jul. 3, 1984

[54] PROCESS FOR PRODUCING PRINTED CIRCUIT BOARDS

[75] Inventors: Mineo Kawamoto, Hitachi; Kanji Murakami, Mito; Yutaka Itoh, Iakahagi; Youichi Matsuda; Motoyo Wajima; Hirosada Moishita, all of Hitachi; Shoji Kawakubo; Toyofusa Yoshimura, both of Ibaraki, all of Japan

[73] Assignee: Hitachi, Ltd., Tokyo, Japan

[21] Appl. No.: 485,399

[22] Filed: Apr. 15, 1983

Related U.S. Application Data

[63] Continuation-in-part of Ser. No. 310,305, Oct. 9, 1981, abandoned.

[30] Foreign Application Priority Data

Oct. 9, 1980 [JP] Japan ............................... 55-140445

[51] Int. Cl.³ ........................... C23C 3/02; H05K 3/18
[52] U.S. Cl. ...................................... 427/98; 427/259; 427/306
[58] Field of Search ........................... 427/98, 306, 259

[56] References Cited

U.S. PATENT DOCUMENTS

| | | | |
|---|---|---|---|
| 3,534,147 | 10/1970 | Bratton | 427/96 |
| 3,546,011 | 12/1970 | Knorre | 427/98 |
| 4,099,974 | 7/1978 | Morishita | 427/437 |
| 4,151,313 | 4/1979 | Wajima | 427/98 |
| 4,212,912 | 7/1980 | Nartusch | 427/98 |
| 4,311,749 | 1/1982 | Hirgiwa | 427/96 |

FOREIGN PATENT DOCUMENTS 55-22841 2/1980 Japan .

*Primary Examiner*—John D. Smith
*Attorney, Agent, or Firm*—Antonelli, Terry & Wands

[57] ABSTRACT

When an alkaline earth metal carbonate powder is mixed with an adhesive and is formed into an adhesive layer in a conventional covering method, a problem of the transfer of catalyst for electroless plating during a masking step or later electroless plating step is solved. Further, blisters under plated film caused by a fire retardant contained in an insulating substrate is also overcome by the use of alkaline earth metal powder.

10 Claims, 5 Drawing Figures

STEP (d)

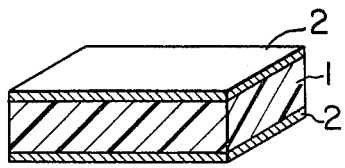
FIG. 1    STEP (a)
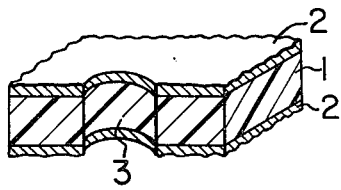
FIG. 2    STEP (b)
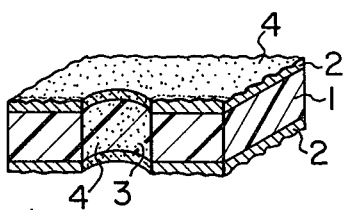
FIG. 3    STEP (c)
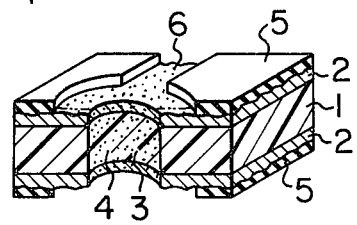
FIG. 4    STEP (d)
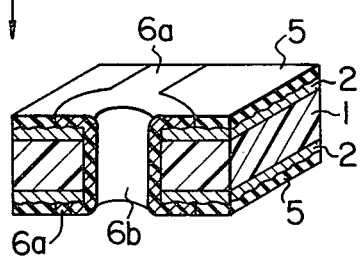
FIG. 5    STEP (e)

PROCESS FOR PRODUCING PRINTED CIRCUIT BOARDS

CROSS-REFERENCE TO RELATED APPLICATIONS

This application is a continuation-in-part of Application Ser. No. 310,305 filed Oct. 9, 1981, and now abandoned.

BACKGROUND OF THE INVENTION

This invention relates to a process for producing a printed circuit board by forming conductor circuits only by an electroless plating (hereinafter referred to as "a full additive process").

As processes for producing printed circuit boards by depositing metal films on circuit forming portions only by an electroless plating method, there is a so-called non-covering method as disclosed in U.S. Pat. No. 4,151,313 which comprises adhering a catalyst for the electroless plating to a whole surface of an insulating substrate, removing the catalyst from the surface except for portions on which circuits are to be formed, and forming circuits by electroless plating. According to this method, since the electroless plating is conducted after the removal of catalyst from the portions wherein no circuit is formed, that is, there is no complicated steps between the step of catalyst removal and the step of electroless plating, there is no problem of transfer of catalyst to the portions on which circuits are to be formed and printed circuit boards having high wiring accuracy without depositing the metal on the portions other than the circuit forming portions can be obtained. But this method has a problem in that high and complicated techniques are necessary for adhering the catalyst to only the circuit forming portions.

In order to solve such a problem, there is employed a so-called covering method (e.g., Japanese Patent Appln. Kokai (Laid-Open) No. 22841/80) comprising the following steps (a) to (e):

(a) forming an adhesive layer on a surface of substrate, (b) roughening the surface of the adhesive layer by, for example, an acid treatment, (c) depositing a catalyst for electroless plating on the roughened surface of the adhesive layer, (d) masking portions other than circuit forming portions with a resist ink by means of, for example, a silk-screen printing method, and (e) forming conductive circuits by electroless plating.

But according to the present inventors' investigation, it has been observed that there very often takes place a trouble of short circuits due to transfer of the catalyst on the circuit forming portions to the resist ink film surface and deposition of a plating film on said resist ink film surface, during the masking step (d) or the later step. The undesirable transfer of catalyst to the resist ink film surface is a problem specifically caused in the covering method comprising the steps (a) through (e) in this order as mentioned above and not caused in other methods disclosed, for example, in U.S. Pat. Nos. 3,546,011, 4,212,912 and 4,311,749. Reasons therefor are not clear. But, it can be estimated that the transfer of catalyst is caused by lowering of the catalyst holding ability of and adhesive layer by the surface roughening treatment with, for example, an acid, which makes the catalyst in the state of easily releasable and contact of the substrate surface with various machines and devices or with other treated substrate during the step of masking resist ink by printing, at a time of stocking before transporting to the step of plating, during the transportation of the substrate to the step of plating or the like. Therefore, removal of the trouble caused by the transfer of catalyst has long been desired.

On the other hand, there often take place blisters under the plating film, when a substrate containing a fire retardant, particularly that of a phosphorous series or a halogen series, is used. Therefore, the removal of such blisters has also long been desired.

SUMMARY OF THE INVENTION

It is an object of this invention to provide a process for producing a printed circuit board having high wiring accuracy by preventing the trouble caused by the transfer of the catalyst for electroless plating to the resist ink film surface and also preventing the blisters caused by the use of a fire retardant.

This invention provide a process for producing a printed circuit board comprising the steps of:

(a) forming an at least partially cured adhesive layer of a homogeneous mixture of an alkaline earth metal carbonate powder in an amount sufficient to prevent transfer of a catalyst to be deposited thereon to masked portions formed after a catalyst deposition step, and a resin component containing predetermined amounts of a thermosetting resin and a synthetic rubber on one or both surfaces of an insulating substrate, (b) roughening and adhesive layer surface or surfaces, (c) depositing a catalyst for electroless plating to the roughened adhesive layer surface, (d) masking portions other than circuit forming portions with a resist ink film, and (e) forming conductive circuits by electroless plating, in this order.

BRIEF DESCRIPTION OF THE DRAWINGS

FIGS. 1 to 5 are partically cross-sectional perspective views showing a process for producing a printed circuit board in accordance with the steps (a) to (e) of this invention.

DESCRIPTION OF THE PREFERRED EMBODIMENTS

It is a very surprising thing that the addition of an alkaline earth metal carbonate power to the adhesive layer can prevent the transfer of the catalyst. The reason is not clear but it is thinkable that the carbonate powder strengthens the surface portion of the adhesive layer, which results in enhancing the catalyst holding ability of the surface of the adhesive layer.

As the carbonate powder, there can be used powders of calcium carbonate, magnesium carbonate, and strontium carbonate, and the like. These carbonate powders can be used alone or as a mixture thereof. Among these carbonates, those which are easily soluble in an acid such as hydrochloric acid, e.g., calcium carbonate, are preferable. But the use of an alkali metal carbonate such as sodium carbonate, etc., is not preferable because of lowering in electrical insulating resistance caused by hygroscopic properties. Further, oxide powders, silicate powders, talc and clay do not show the effect for preventing the transfer of catalyst to the resist ink film surface. It is preferable to use the carbonate powder having a particle size of 50 to 60 $\mu$m or less in general, more preferably 1 to 6 $\mu$m or less.

The carbonate powder can be used in an amount of preferably 1 to 25 parts by weight, more preferably 5 to 20 parts by weight, based on 100 parts by weight of the resin component in the adhesive layer. If the amount is too small, the effect of the addition of carbonate powder cannot be obtained, while if the amount is too much, there is a tendency to gradually lower the film strength of the adhesive layer by itself or the adhesive strength between the adhesive layer and the electroless plating film.

As the resin component as adhesive, there can be used conventionally used ones such as a synthetic rubber such as acrylonitrile-butadiene rubber (NBR), acrylonitrile-butadiene-styrene rubber (ABS), chloroprene rubber, neoprene, butadiene rubber, etc., and a mixture thereof. But considering heat resistance, particularly resistance to soldering of the adhesive layer, the use of one or more heat resistance resins such as thermosetting resins, a mixture of one or more thermosetting resins and one or more synthetic rubbers mentioned above, or a synthetic rubber modified with a thermosetting resin is preferable. Examples of such heat resistant resins are a phenolic resin or a phenolic resin modified synthetic rubber, an epoxy resin, a mixture of a synthetic rubber and a phenolic resin, a mixture of a synthetic rubber, a phenolic resin and an epoxy resin, a mixture of a synthetic rubber and an epoxy resin, a mixture of a phenolic resin and an epoxy resin, and the like. In the mixture of a thermosetting resin and a synthetic rubber, it is preferable to use the thermosetting resin in an amount of 30 to 70 parts by weight and the synthetic rubber in an amount of 70 to 30 parts by weight, the total being 100 parts by weight.

The adhesive layer may further contain, in addition to the carbonate powder and the resin component up to 50 parts by weight, preferably 5 to 50 parts by weight, of silica powder, up to 10 parts by weight, preferably 0.1 to 10 parts by weight, of sulfur powder, and up to 10 parts by weight, preferably 0.1 to 10 parts by weight of zinc oxide powder, based on 100 parts by weight of the resin component. Among these additives, sulfur itself is effective for preventing the catalyst from the transfer to the resist ink film surface and such an effect increases with an increase of the amount of sulfur. But the use of too much sulfur is not preferable due to undesirable influences on the electroless plating step.

One preferable example of the adhesive layer composition is as follows:

| | |
|---|---|
| Acrylonitrile-butadiene rubber (NBR) | 60 parts by weight |
| Resol type phenol resin | 40 |
| Silica powder | 15 |
| Sulfur powder | 2 |
| Zinc oxide powder | 1 |
| Calcium carbonate powder | 15 |

The above-metnioned resin component can be mixed with the carbonate powder and if necessary other additives by a conventional process.

The formation of the adhesive layer containing the carbonate powder on a substrate (the step (a)) can be carried out according to a conventional process.

As the insulating substrate, there can be used conventional ones such as phenolic resin laminates, epoxy resin laminates, imide resin laminates, ceramic plates, metal plates (e.g., steel plate), etc. In such a case, even if the carbonate powder is incorporated into the substrate in place of the adhesive layer, the objects of the present invention cannot be attained.

The resulting substrate coated with adhesive layers is shown in FIG. 1, wherein numeral 1 denotes an insulating substrate and numeral 2 an adhesive layer.

The step (b) of roughening the adhesive layer surface can be carried out by a conventional process such as an acid treatment, or mechanical treatment. Prior to the roughening step, through-holes can be provided to the substrate, if desired. In the acid treatment, there is usually used a mixed acid such as a mixture of chromic acid and sulfuric acid, a mixture of chromic acid and borofluoric acid, or the like.

The resulting roughened substrate is shown in FIG. 2, wherein numeral 3 denotes a through hole, other numerals being the same as mentioned above.

The step (c) of depositing a catalyst for electroless plating can be carried out according to a conventional process.

The catalyst for electroless plating can be selected properly depending on the kind of plating metal. A typical example of the catalyst is palladium chloride but, needless to say, other conventional catalysts for electroless plating can be used. As a plating solution, there can be used conventional ones (as disclosed in U.S. Pat. No. 4,099,974), for example, an alkaline electroless copper plating solution containing as major components copper sulfate, ethylenediaminetetraacetic acid as a complexing agent, and formaldehyde as a reducing agent in the case of electroless plating of copper, an electroless nickel plating solution containing as major components nickel chloride, a hypophosphite salt as a reducing agent in the case of electroless plating of nickel, etc.

The resulting catalyst deposited substrate is shown in FIG. 3, wherein numeral 4 denotes a catalyst for electroless plating, other numerals being the same as mentioned above.

The step (d) of masking can be carried out according to a conventional process. As a resist film, there can be used a conventional one, for example, a film made from an epoxy resin as a major component which is excellent in alkali resistance.

The resulting resist-masked substrate is shown in FIG. 4, wherein numeral 5 denotes a resist ink film, other numerals being the same as mentioned above.

The step (e) of electroless plating can be carried out by a conventional process.

The resulting printed circuit board is shown in FIG. 5, wherein numeral 6a denotes a conductive circuit, numeral 6b a conductor along the through hole inner wall (conductive circuit), other numerals being the same as mentioned above.

The effects of this invention can by far remarkably be exhibited when the substrate contains a fire retardant, particularly that of a phosphorus series and/or halogen series fire retardant. That is, when a fire retardant resin laminate obtained by adding a fire retardant thereto or a laminate obtained by adding a fire retardant resin having been introduced halogen atoms such as bromine into its molecular structure, for example, a brominated epoxy resin to a resin forming the laminate is used as a substrate, there very often take place blisters between the plating layer and the adhesive layer. Such bisters can surprising be prevented by the carbonate powder.

As the fire retardant, there can be used phosphorus series fire retardants, e.g., red phosphorus, phosphoric acid esters, tris(aziridinyl)phosphine oxide, tetrakis-(hydroxymethyl)phosphonium chloride, hyroxymethylureidomethyl phosphonium chloride, n-methyloldimethyl-phosphoropropionamide, phosphorylamide, etc.; halogen series fire retardants, e.g., brominated epoxy resins, chlorendic anhydride; benzoguanamine, hydrated alumina, etc. These fire retardants can be used alone or as a mixture thereof in an amount of 5 to 30% by weight in usual cases based on the weight of the substrate, but in some cases, for example, in the case of a brominated epoxy resin, it is used in an amount of about 80% by weight based on the weight of the substrate when the frame-retardancy grade of V-0 in UL 94 is required.

A reason for bringing about the blisters is not clear, but it is estimated that the fire retardant or the halogen atom in the resin contained in the insulating substrate denatures the adhesive per se, or gives bad influence to the catalyst through the adhesive layer, which accelerates the blisters of the plating film and/or the transfer of the catalyst.

According to this invention, such blisters can be prevented sufficiently.

This invention is illustrated by way of the following Examples, in which all parts and percents are by weight, unless otherwise specified.

EXAMPLE 1

As a substrate, a fire retardant paper base phenolic resin laminate (fire retardant: a brominated epoxy resin and a phosphoric acid ester; the content 30%) was used. As an adhesive, there was used an adhesive solution, using methyl isobutyl ketone as an organic solvent, of phenol resin modified acrylonitrile-butadiene rubber (sulfur content: 2 parts per 100 parts of the rubber component) mixed with calcium carbonate ($CaCO_3$) powder having an average particle size of 1 $\mu$m. Said adhesive solution was coated on a surface of the substrate by a flow coating method and heat treated at 130° C. for 30 minutes. Subsequently, another surface of the substrate was coated with the same adhesive solution as mentioned above, and heat treated at 160° C. for 100 minutes to cure the adhesives on the both sides. The thickness of the adhesive layer was about 30 $\mu$m. The $CaCO_3$ content in the adhesive layer was about 5%.

After drilling through holes for inserting terminals of electronic parts at prescribed portions, the resulting substrate was dipped in a mixed acid solution prepared by dissolving 60 g of $CrO_3$ and 220 ml of concentrated sulfuric acid in water and making the whole volume of the solution 1 liter, at 45° C. for 5 minutes to roughen the surfaces of the adhesive layers, followed by washing with water. Subsequently, the roughened substrate was dipped in an aqueous NaOH (4 g/liter) solution for 5 minutes, followed by washing with water, and dipped in a 18% HCl solution for 1 minute. Then, the substrate was dipped in a catalyst solution for electroless plating, i.e., an acidic aqueous solution of hydrochloric acid containing palladium chloride and stannous chloride (HS 101B, manufactured by Hitachi Chemical Co., Ltd.) for 10 minutes, followed by washing with water. Subsequently, the substrate was dipped in an aqueous solution of a mixed acid of 10 ml of concentrated hydrochloric acid and 0.2 g of oxalic acid obtained by dissolving the mixed acid in water and making the whole volume 1 liter, for 5 minutes, washed with water and dried at 120° C. for 20 minutes to deposit the catalyst for electroless plating to the surfaces of the adhesive layers. Then, a resist ink having the following composition was coated on portions other than circuit forming portions on a surface of the substrate by a screen printing process and heated at 130° C. for 30 minutes. The same treatment as mentioned above was conducted on the other surface of the substrate and heat treatment at 150° C. was carried out for 40 minutes to cure the resist inks on both sides for masking.

| [Composition of resist ink] | | |
|---|---|---|
| (a) Bisphenol A type epoxy resin | 100 | parts |
| (b) Acrylic ester type copolymer | 3 | parts |
| (c) Aluminum silicate | 5 | parts |
| (d) Solid solution of Ni, Ti and Sb oxides | 20 | parts |
| (e) Colloidal silica | 5 | parts |
| (f) Zirconium silicate powder | 5 | parts |
| (g) Phthalocyanine Green | 3 | parts |
| (h) Silicone defoaming agent | 1.5 | parts |
| (i) Methyl carbitol | 53 | parts |
| (j) Diaminodiphenylmethane | 12.5 | parts |
| (k) Phenyl glycidyl ether | 3 | parts |
| (l) 2-Ethyl-4-methylimidazole | 0.5 | parts |

After curing the resist ink, one surface of the resulting substrate was strongly rubbed with a finger several times for testing the transfer of catalyst. Then, the substrate was dipped in a solution of surface active agent for 2 minutes, washed with water, and dipped in an electroless copper plating solution having the following composition with stirring by air to conduct electroless plating at 72° C. for 10 hours. Conductor (Cu) circuits of about 28 $\mu$m thick were formed on the substrate to give a two-sided, printed circuit board with plated through-holes.

| [Composition of electroless copper plating solution] | |
|---|---|
| (a) $CuSO_4 \cdot 5H_2O$ | 10 g |
| (b) Disodium ethylenediaminetetracetic acid | 30 g |
| (c) Formalin (37%) | 3 ml |
| (d) Polyethylene glycol (average molecular weight 600) | 20 g |
| (e) 2,2'-Dipyridyl | 0.03 g |
| (f) NaOH | 11 g |
| (g) Water | Necessary for making the total amount 1000 ml |

EXAMPLE 2

A two-sided, printed circuit board with plated through-holes was produced in the same manner as described in Example 1 except for using 10% of calcium carbonate powder based on the weight of the adhesive layer in place of 5%.

EXAMPLE 3

A two-sided, printed circuit board with plated through-holes was produced in the same manner as described in Example 1 except for using 20% of calcium carbonate powder based on the weight of the adhesive layer in place of 5%.

EXAMPLE 4

A two-sided, printed circuit board with plated through-holes was produced in the same manner as described in Example 1 except for changing the average particle size of calcium carbonate powder to about 3 $\mu$m.

EXAMPLE 5

A two-sided, printed circuit board with plated through-holes was produced in the same manner as described in Example 1 except for changing the average particle size of calcium carbonate to about 0.5 μm.

EXAMPLE 6

A two-sided, printed circuit board with plated through-holes was produced in the same manner as described in Example 1 except for using barium carbonate powder having an average particle size of 2 μm in place of calcium carbonate powder.

EXAMPLE 7

A two-sided, printed circuit board with plated through-holes was produced in the same manner as described in Example 1 except for changing the sulfur content of the rubber component in the adhesive to 4 parts per 100 parts of the rubber component.

EXAMPLE 8

A two-sided, printed circuit board with plated through-holes was produced in the same manner as described in Example 1 except for changing the sulfur content of the rubber component in the adhesive to 10 parts per 100 parts of the rubber component.

EXAMPLE 9

A two-sides, printed circuit board with plated through-holes was produced in the same manner as described in Example 1 except for using an epoxy resin laminate containing brominated epoxy resin (bromine content: 50%) as a substrate.

EXAMPLE 10

A two-sided, printed circuit board with plated through-holes was produced in the same manner as described in Example 1 except for using a fire retardant phenol resin laminate containing a phosphate ester (phosphorus content; 10%, and not containing brominated epoxy resin) as a substrate.

EXAMPLE 11

A two-sided, printed circuit board with plated through-holes was produced in the same manner as described in Example 1 except for using a non-fire retardant paper base phenolic resin laiminate in place of the fire retardant paper base phenolic resin laminate.

COMPARATIVE EXAMPLE 1

A two-sided, printed circuit board with plated through-holes was produced in the same manner as described in Example 1 without using calcium carbonate.

COMPARATIVE EXAMPLE 2

A two-sided, printed circuit board with plated through-holes was produced in the same manner as described in Example 9 without using calcium carbonate.

COMPARATIVE EXAMPLE 3

A two-sided, printed circuit board with plated through-holes was produced in the same manner as described in Example 10 without using calcium carbonate.

COMPARATIVE EXAMPLE 4

A two-sided, printed circuit board with plated through-holes was produced in the same manner as described in Example 11 without using calcium carbonate.

In each Examples and Comparative Examples, 10 two-sided, printed circuit boards with plated through-holes were produced, respectively. In Examples 1 to 11, no deposition of copper outside the circuit forming portions was observed. Particularly, in Examples 7 and 8, the rubbing with a finger was conducted stronger than the other Examples, but no copper deposition outside the circuit forming portions was observed. This means that the transfer of catalyst most hardly takes place in Examples 7 and 8.

On the other hand, in Comparative Examples 1 to 4, remarkable deposition of copper on portions other than the circuit forming portions was observed and the resulting printed circuit boards were not able to be used practically. Further, small blisters were observed in 5 samples among 10 in Comparative Examples 1 to 3 and 2 samples among 10 in comparative Example 4 (each 20 or more places in one sample). In contrast, no blister was observed in the samples of Examples 1 to 11.

No peeling was observed in the printed circuit boards obtained in Examples 1 to 11 when subjected to a soldering heat resistance test, while about 50% of the samples (printed circuit boards) obtained in Comparative Examples were peeled by the soldering heat resistance test.

The soldering heat resistance test was conducted as follows:

A land in a pattern portion of a printed circuit board was touched by a soldering bit of 400° C. for 2 seconds. After cooling to room temperature, the above-treated land portion was scratched with a pincette and peeling of the plated film was observed.

COMPARATIVE EXAMPLE 5

A two-sided, printed circuit board with plated through-holes was produced in the same manner as described in Example 1 except for using 10 parts of talc (according to the suggestion of U.S. Pat. No. 4,212,912) having an average particle size of 2 μm in place of calcium carbonate in the adhesive layer.

COMPARATIVE EXAMPLE 6

A two-sided, printed circuit board with plated through-holes was produced in the same manner as described in Example 1 except for using 10 parts by weight of clay (according to the suggestion of U.S. Pat. No. 4,212,912) having an average particle size of 3 μm in place of calcium carbonate in the adhesive layer.

COMPARATIVE EXAMPLE 7

A two-sided, printed circuit board with plated through-holes was produced in the same manner as described in Example 1 except for adding 5% of calcium carbonate having an average particle size of 1 μm to the fire retardant paper base phenolic resin laminate used in Example 1 and using an adhesive solution obtained by removing calcium carbonate powder from the adhesive solution used in Example 1.

The transfer of catalyst was tested in the same manner as described in Comparative Examples 1 to 4. In Comparative Examples 5 to 7, remarkable deposition of copper on portions other than the circuit forming portions was observed and the resulting printed circuit boards were not able to be used practically. Further, small blisters were observed in 5 samples in 10 in Comparative Examples 5 and 6 and 6 samples among 10 in Comparative Example 7 (each 20 or more places in one sample). In addition, the samples obtained in Comparative Examples 5 to 7 were inferior to those of Examples 1 to 11 in the soldering heat resistance at 400° C. or higher.

COMPARATIVE EXAMPLES 8 to 11

Two-sided, printed circuit boards with plated through-holes were produced in the same manner as described in Example 1 except for replacing the calcium carbonate in the adhesive layer by a material shown in the following Table 1. The results are as shown in Table 1.

TABLE 1

| Comparative Example No. | Material | Average particle size ($\mu$m) | Transfer of catalyst | Blist-[*1] ers | Soldering heat resistance (at 400° C.) |
|---|---|---|---|---|---|
| 8 | $ZrSiO_4$ | 5 | Yes | 5/10 | Partial peeling was produced. |
| 9 | $ZrO_2$ | 3 | Yes | 6/10 | Partial peeling was produced. |
| 10 | $CaSiO_4$ | 1 | Yes | 6/10 | Partial peeling was produced. |
| 11 | $SiO_2$ | 1 | Yes | 6/10 | Partial peeling was produced. |

Note
[*1]: "5/10" means that blisters were produced in 5 samples among 10 samples.

As is clear from Table 1, no satisfactory results were obtained in Comparative Examples 8 to 11 in the prevention of transfer of catalyst, the prevention of generation of blisters and the soldering heat resistance.

What is claimed is:

1. A process for producing a printed circuit board comprising the steps of:
   (a) forming an at least partially cured adhesive layer of a homogeneous mixture of an alkaline earth metal carbonate powder in an amount sufficient to prevent transfer of a catalyst to be deposited thereon to masked portions formed after a catalyst deposition step, and a resin component containing predetermined amounts of a thermosetting resin and a synthetic rubber on one or both surfaces of an insulating substrate,
   (b) roughening the adhesive layer surface or surfaces,
   (c) depositing a catalyst for electroless plating to the roughened adhesive layer surface,
   (d) masking portions other than circuit forming portions with a resist ink film, and
   (e) forming conductive circuits by electroless plating.

2. A process according to claim 1, wherein the alkaline earth metal carbonate is calcium carbonate, magnesium carbonate, strontium carbonate, or a mixture thereof.

3. A process according to claim 1, wherein the amount of alkaline earth metal carbonate powder is 1 to 25 parts by weight based on 100 parts by weight of the resin component in the adhesive layer.

4. A process according to claim 1, wherein the substrate contains a fire retardant.

5. A process according to claim 4, wherein the fire retardant is a phosphorus series, a halogen series fire retardant or a mixture thereof.

6. A process according to claim 5, wherein the phosphorus series fire retardant is red phosphorus or a phosphate.

7. A process according to claim 5, wherein the halogen series fire retardant is a brominated epoxy resin.

8. A process according to claim 1, wherein the resin component is a mixture of 70 to 30 parts by weight of a synthetic rubber and 30 to 70 parts by weight of a thermosetting resin, the total being 100 parts by weight.

9. A process for producing a printed circuit board comprising the steps of:
   (a) forming an at least partially cured adhesive layer of a homogeneous mixture of an alkaline earth metal carbonate powder in an amount sufficient to prevent transfer of a catalyst to be deposited thereon to masked portions formed after a catalyst deposition step, a resin component containing predetermined amounts of a thermosetting resin and a synthetic rubber, and sulfur on one or both surfaces of an insulating substrate,
   (b) roughening the adhesive layer surface or surfaces,
   (c) depositing a catalyst for electroless plating to the roughened adhesive layer surface,
   (d) masking portions other than circuit forming portions with a resist ink film, and
   (e) forming conductive circuits by electroless plating.

10. A process according to claim 9, wherein the amount of alkaline earth metal carbonate is 1 to 25 parts by weight and the amount of sulfur is 0.1 to 10 parts by weight, based on 100 parts by weight of the resin component.

* * * * *